United States Patent
Uchikawa et al.

(10) Patent No.: US 6,212,059 B1
(45) Date of Patent: Apr. 3, 2001

(54) CAPACITOR INCLUDING BARIUM STRONTIUM TITANATE FILM

(75) Inventors: Fusaoki Uchikawa; Shigeru Matsuno; Shinichi Kinouchi; Hisao Watarai, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/592,862

(22) Filed: Jun. 13, 2000

Related U.S. Application Data

(62) Division of application No. 09/112,569, filed on Jul. 9, 1998, now Pat. No. 6,103,002, which is a continuation of application No. 08/677,317, filed on Jul. 2, 1996, now Pat. No. 6,063,443, which is a division of application No. 08/367,745, filed on Jan. 3, 1995, now Pat. No. 5,555,154, which is a continuation of application No. 08/121,341, filed on Sep. 14, 1993, now abandoned.

(30) Foreign Application Priority Data

Sep. 22, 1992 (JP) .................................................... 4-252836
Jul. 27, 1993 (JP) .................................................... 5-184904

(51) Int. Cl.$^7$ ....................................................... H01G 4/10
(52) U.S. Cl. ................. 361/321.5; 361/322; 106/287.19; 106/287.24
(58) Field of Search ................................ 361/321.5, 322; 106/287.19, 287.24

(56) References Cited

U.S. PATENT DOCUMENTS

| | | |
|---|---|---|
| 3,970,037 | 7/1976 | Sopko . |
| 4,501,602 | 2/1985 | Miller et al. . |
| 4,558,144 | 12/1985 | Fay et al. ................................ 556/40 |
| 4,668,299 | 5/1987 | Nanao et al. . |
| 4,734,514 | 3/1988 | Melas et al. . |
| 5,006,363 | 4/1991 | Fujii et al. . |
| 5,104,690 | 4/1992 | Greenwald . |
| 5,200,388 | 4/1993 | Abe et al. . |
| 5,204,314 | 4/1993 | Kirlin et al. ............................ 505/1 |
| 5,225,561 | 7/1993 | Kirlin et al. . |
| 5,266,355 | 11/1993 | Wemberg et al. . |
| 5,372,850 | 12/1994 | Uchikawa et al. . |
| 5,376,409 | 12/1994 | Kaloyeros et al. ................ 427/248.1 |
| 5,453,494 | 9/1995 | Kirlin et al. . |
| 5,555,154 | 9/1996 | Uchikawa et al. ................... 361/322 |
| 5,776,254 | 7/1998 | Yuuki et al. .......................... 118/725 |
| 6,063,443 | * 5/2000 | Uchikawa et al. ............. 427/255.32 |
| 6,103,002 | * 8/2000 | Uchikawa et al. .............. 106/287.19 |

FOREIGN PATENT DOCUMENTS

| | | |
|---|---|---|
| 4-232272 | 8/1992 | (JP) . |
| 5-117855 | 5/1993 | (JP) . |
| 5-132776 | 5/1993 | (JP) . |

OTHER PUBLICATIONS

"Thickness Dependence & Properties of PZT Thin Film by MOCVD" 52nd Applied Physics Association Seminar. Abstract in Japanese no date provided.

S. Matsuno et al., "Critical Current Properties Under High Magnetic Fields Up to 30 T for Y–Ba–Cu–O Films by MOCVD", IEEE Transactions on Magnetics. vol. 27 No. 2 (Mar. 1991) pp. 1398–1401.

S. Matsuno, et al., "Reproducible Preparation and Properties of Y–Ba–Cu–O Films by MOCVD", Proceeds of 3rd Int'l Symp. on Superconductivity, (Nov. 6–9, 1990.).

"Metalorganic Chemical Vapor Deposition Using a Single Solution Source for High $J_c Y_1 B_{a2} Cu_3 O_{7-x}$ Superconducting Films", Matsuno et al., Appl. Phys. Lett. vol. 60, No. 19, pp. 2427–2429. (May 1992.).

S. Matsuno et al., "Isotropic $J_c$–B Properties of $YBa_2Cu_3O_{7-x}$ Thin Films Containing Fine Precipitates by Metalorganic Chemical Vapor Deposition", Appl. Phys. Lett., vol. 62. No. 13, pp. 1556–1558, (Mar. 29, 1993).

L.A. Wills et al., "Epitaxial growth of $BaTiO_3$ thin films by organometallic chemical vapor deposition", Appl. Phys. Lett., vol. 60, No. 1, (Jan. 6, 1992) pp. 41–43 Abstract in Japanese.

"Physicochemical Properties of Metalorganic Compounds for MOCVD of Dielectric Substance" 52nd Applied Physics Associated Seminar. no date provided.

Hiroshi Funakubo et al., "Preparation of Epitaxial $BaTiO_3$ and $SrTiO_3$ Films by CVD", Journal of Chemical Vapor Deposition, vol. 1 (Jul. 1992).pp. 73–86.

* cited by examiner

*Primary Examiner*—David Brunsman
(74) *Attorney, Agent, or Firm*—Leydig, Voit & Mayer, Ltd.

(57) ABSTRACT

A capacitor for memory devices including a barium strontium titanate system dielectric film, the film being formed from a chemical vapor deposition source material including a liquid solution of respective organometallic compounds of barium, strontium, and titanium dissolved in tetrahydrofuran.

15 Claims, No Drawings

CAPACITOR INCLUDING BARIUM STRONTIUM TITANATE FILM

This is a division of application 09/112,569, filed Jul. 9,1998, now U.S. Pat. No. 6,103,002 which is a continuation of application 08/677,317, filed Jul. 2, 1996, now U.S. Pat. No. 6,063,443 which is a division of application 08/367,745, filed Jan. 3, 1995, now U.S. Pat. No. 5,555,154 which is a file wrapper continuation application of 08/121,341, filed Sep. 14, 1993, now abandoned.

BACKGROUND OF THE INVENTION

1. Field of the Invention

The invention relates to material for a chemical vapor deposition (CVD) method for forming an oxide-system dielectric thin film used for a dielectric memory and a dielectric filter and the like, and also relates to a capacitor for a memory device formed by the material.

2. Description of the Prior Art

In recent years, the integration of semi-conductor memory devices has rapidly advanced. For example, regarding the dynamic random access memory (DRAM), bit number has increased at the sudden pace of, for example, 4 times in 3 years.

This is because of attaining a high speed of device, and low consumption power and low cost. But, even if an integration degree is improved, a capacitor which comprises one of the elements in the DRAM must have a certain value of capacitance. From this reason, it is necessary to cause the film thickness of capacitor material to be thin. Therefore, the thickness of the thin film using SiO2 which has been used so far is limited for thinner film. If the dielectric constant increases by changing material, it is able to obtain thinner film as well as a certain amount of capacity.

Accordingly, studies for the dielectric material which has a large dielectric constant and is used as a capacitor for a memory device become the object of public attention these days.

Regarding the performance required for capacitor material, it has been most important that the material is a thin film which has a large dielectric constant and has a small leak current. That is, it is necessary to use a large dielectric constant material and also a thinner film and to make the leak current be minimum. For a general development aim, it is desirable that the $SiO_2$ equivalent thickness of the thin film be less than 1 nm and the leak current density be less than on the order of $10^{-8}$ $A/cm^2$ when 1.65 V is applied to the thin film. For forming a thin film on the capacitor electrode of the DRAM having stage difference, it is profitable for the process to cause the thin film to stick well around the complex shape of the body using the CVD method. From the above points of view, an oxide-system dielectric thin film such as tantalum-oxide, lead-titanium zirconate (PTZ), lead- lanthanum-zirconium titanate (PLZT), strontium titanate and barium titanate are examined for forming a thin film using all kinds of film formation methods. Though it is most advantageous to form a film using the CVD method, it is troublesome that there is no material as a raw material compound (referred to raw material, below) having good stability and vaporization characteristics for CVD. This is because the heating vaporization characteristics of the dipivaloyl-methane (DPM) compound of β-diketonate-system is principally not good, which is used a lot as a raw material for CVD. It is pointed out that this is a substantial defect caused by essential instability of the metal DPM compound, for example, in the 52th Applied Physics Association Seminar preliminary report No. 9a-P-11. As shown in the report No. 9a-P-11, the CVD method is still studied in spite of the above defect. It happens at an extreme occasion that the raw material has to be thrown away during the film forming when the raw material is unstable. Accordingly, when the raw material mentioned above has the defect, good performance of the dielectric thin film and good manufacturing repeatability are not obtained at present.

As described above, regarding the method for manufacturing an oxide-system dielectric thin film by conventional CVD method, since the CVD material has less stability and bad vaporization, it is impossible to heat the CVD raw material at a low temperature and transport it stably to the CVD reactor.

Therefore, it is difficult to control the composition and also there is a big problem that a dielectric film can not be formed stably in order to get good characteristics. On the other hand, if the raw material is heated at a high temperature in order to increase the vaporization efficiency, thermal decomposition occurs during transporting the raw material. Therefore, a crystallization failure of the film or composition drift inevitably occurs. In addition, the raw material is thrown away inconveniently as described above. If the composition (reaction) time becomes long by suppressing vaporization speed, the vaporization state of the raw material changes as time goes by. Therefore, the film composition becomes heterogeneous toward the thickness direction, and thus the leak current inevitably increases. For this reason, the development is strongly expected to obtain CVD material having good and stable vaporization in a low temperature heating if the CVD material is used for a number of times and a long period. But, there is still no further progress with respect to the technique.

Therefore, the CVD material for forming an oxide-system dielectric thin film of the present invention is invented to eliminate the above defect which occurs in raw material used in the conventional CVD. According to the material of the present invention, it is different from the conventional material in that the conventional multi-source materials need to be separately vaporized, while in the present invention the material are liquidized and at the same time vaporized and transported stably to the reactor. Accordingly, it is able to form the dielectric thin film for a capacitor having a good performance with good repeatability. DPM compound which is used frequently in the conventional CVD method as described above, it is proved that these compounds of CVD raw material for oxide-system dielectric thin film capacitor of the present invention, especially, such as the alkaline earth metal of Ba and Sr and the solid state compound of Pb and Ti, is not in a stable state and also not in a good vaporization state. Therefore, when the oxide-system dielectric thin film comprised of these metal oxide is formed by a CVD method, it is proved for a multi-source material that it is difficult to control an object composite on and to form a film continuously.

Accordingly, in the present invention, the inventors found that the controllability of the composition is improved and a dielectric film having desired characteristic is formed continuously with good repeatability by dissolving these compounds in the solvent which includes tetra-hydrofuran as a main component for maintaining these compound stable for a long period in order to make one solution, and by evaporating the solution in a relatively low temperature heating without heat decomposition. Especially, in this invention, the repeatability for forming the film is remarkably improved in case that the film is formed continuously if liquid raw material is used when forming an oxide-system dielectric thin film in the multi-component materials. Therefore, the performance of the dielectric film is remarkably improved by using the dielectric film as a capacitor used for memory devises.

Regarding many kinds of organic solvents other than the tetra-hydrofuran, the inventors investigated in detail in relation to the dissolving capacity of the material for composing the dielectric thin film comprised of the solid organometallic compound, a evaporation characteristic of the solution and a long life stability. The result shows that there found many solvents which could dissolve the solid material well. But there found no good solvent having good heat vaporization and long life stability when making a solution by dissolving the raw material compound used as the dielectric film comprised of the organometallic compound such as the tetra-hydrofuran.

Therefore, the CVD raw material of the present invention is used for forming the oxide-system dielectric thin film having single or multi-components, and which is liquid raw material in which at least one kind of organic material is dissolved in the tetra-hydrofuran and also can be attained in a stable state and in a good repeatability of evaporation by heating. Especially, in the present invention, the same raw material can be used for a number of times without reducing the evaporation characteristic, which was impossible to be carried out so far.

The above explanation is also applied to liquid material in which the organometallic compound is dissolved in the solvent including the tetra-hydrofuran.

It is desirable to use at least one kind of metals selected among Pb, Ti, Zr and alkaline earth metal as the metal atom of the organometallic compound.

It is desirable to use a compound wherein the metal atom is coupled with organic groups through oxygen atoms as the organometallic compound.

Regarding the compound wherein the metal atom is coupled with organic groups through oxygen atoms, it is desirable to use at least one kind of metals selected among Pb, Ti, Zr and alkaline earth metal as the metal, atom.

Regarding the compound wherein the metal atom is coupled with organic groups through oxygen atoms, it is desirable that the metal atom comprises Sr and/or Ba and Ti.

Regarding the compound wherein the metal atom is coupled with organic groups through oxygen atoms, it is desirable to use acetyl-acetonates, dipivaloyl-methanates, alkoxides, hexafluoro-acetyl-acetonates, penta-fluoro-propanoil-pivaloyl-methanates, cyclopentadienyl which are selected at least among groups of Pb, Ti, Zr and alkaline earth metal, or one or more kinds of those derivatives.

Regarding the compound wherein the metal atom is coupled with organic groups through oxygen atoms, it is desirable to use Sr and/or Ba and Ti dipivaloyl-methanate system compound.

Regarding the compound wherein the metal atom is coupled with organic groups through oxygen atoms, it is desirable to use Sr and/or Ba dipivaloyl-methanate system compound and Ti alkoxide.

Regarding the compound wherein the metal atom is coupled with organic groups through oxygen atoms, it is desirable to use Sr and/or Ba dipivaloyl-methanate system compound and Ti iso-propoxide.

In the capacitor used for memory devises of the present invention, the dielectric film for the capacitor is formed by CVD method using tetra-hydrofuran or CVD raw material for oxide-system dielectric thin film in which the organometallic compound is dissolved in the solvent including the tetra-hydrofuran.

SUMMARY OF THE INVENTION

Accordingly, it is an object of the present invention to provide a CVD raw material for oxide-system dielectric thin film having a good performance used for forming a capacitor.

According to one aspect of the present invention, there is provided CVD raw material for oxide-system dielectric thin film in which organometallic compound is dissolved in tetra-hydrofuran.

Another aspect of the present invention, there is provided CVD raw material for oxide-system dielectric thin film in which organometallic compound is dissolved in solvent including tetra-hydrofuran.

Another aspect of the present invention, there is provided CVD raw material for oxide-system dielectric thin film, wherein the metal atom of the organic metal raw material is one of the metals which is selected at least among the group of Pb, Ti, Zr and alkaline earth metal.

Another aspect of the present invention, there is provided CVD raw material for oxide-system dielectric thin film, wherein the organic metal raw material is a compound in which the metal atom is coupled with organic groups through oxygen atoms.

Another aspect of the present invention, there is provided CVD raw material for oxide-system dielectric thin film, wherein the metal atom is Sr and/or Ba and Ti.

Another aspect of the present invention, there is provided CVD raw material for oxide-system dielectric thin film, wherein the raw material compound is one of acetyl-acetonates of metals selected among at least the group of Pb, Ti, Zr and alkaline earth metal, dipivaloyl-methanates of metals selected among at least the group of Pb, Ti, Zr and alkaline earth metal, alkoxides of metals selected among at least the group of Pb, Ti, Zr and alkaline earth metal, hexafluoro-acetyl-acetonates of metals selected among at least the group of Pb, Ti, Zr and alkaline earth metal, penta-fluoro-propanoil-pivaloyl-methanates of metals selected among at least the group of Pb, Ti, Zr and alkaline earth metal, cyclopentadienyl of metals selected among at least the group of Pb, Ti, Zr and alkaline earth metal, and one or more derivatives of those raw material compounds.

Another aspect of the present invention, there is provided CVD raw material for oxide-system dielectric thin film, wherein the compound is a Sr and/or Ba dipivaloyl-methanate system compound and Ti dipivaloyl-methanate.

Another aspect of the present invention, there is provided CVD raw material for oxide-system dielectric thin film, wherein the compound is Sr and/or Ba dipivaloyl-methanates and Ti alkoxide.

Another aspect of the present invention, there is provided CVD raw material for oxide-system dielectric thin film, wherein the compound is Sr and/or Ba dipivaloyl-methanates and Ti iso-propoxide.

Another aspect of the present invention, there is provided a capacitor for memory devises which is formed by CVD method using CVD raw material for oxide-system dielectric thin film.

DETAILED DESCRIPTION OF THE PREFERRED EMBODIMENTS

Embodiment 1

An experiment was carried out using the ordinary hot wall type CVD equipment for investigating the vaporization of the raw material of the invention. The raw material compound is acetyl-acetonate derivative comprised of Sr and Ba having especially less vaporization and poor stability. The two materials are mixed to obtain two kinds of solutions dissolved in the tetra-hydrofuran by 0.3 mol % concentration. The deposition quantity of the strontium oxide and the barium oxide on a magnesium oxide substrate are measured using weight method by heating the solution for a plurality of numbers of the continuous vaporization at the temperature of 220° C. Further, the deposition quantity of the strontium oxide and the barium oxide on the same substrate are measured by heating the solution at the vapor temperature of 180–240° C. for every 20° C., using a weight method. The above respective depositions are confirmed to be films of the oxide Sr or Ba using X-ray diffraction.

The deposition quantity of these three cases on the oxide magnesium circuit board of Sr oxide and Ba oxide are compared with the deposition quantity of the present invention in the following TABLE 1~TABLE 4.

For comparison, the same raw material compound is dissolved in the methanol solution or acetone solution instead of the tetra-hydrofuran at the same formation condition and using the same equipment. And the solid raw material organometallic compound without using organic solvent is used by CVD method.

As is apparent from TABLE 1 and 3, in case the CVD raw material of the present invention is used, the deposition quantity of oxide film more than 20 times is obtained in comparison with the conventional solid raw material organometallic compound, the methanol solution and the acetone solution for the first vaporization at the same heating temperature.

In case of the raw material of the present invention, stable deposition quantity is obtained for further continuous vaporization. But, in case of other raw materials, the deposition quantity of the oxide film decreases for the further number of continuous vaporization. As is apparent from TABLE 2 and 4, in case the raw material of the present invention is used, good deposition quantity of oxide film is obtained at any temperature in comparison with the other three solutions, because the present invention has good vaporization.

An experiment was carried out for investigating the deposition quantity under the continuous vaporization over 10 times on the same condition shown in TABLE 1 and TABLE 3. The result shows that in case of the conventional solid raw material organometallic compound, the methanol solution and the acetone solution, the deposition quantity obtained from the evaporation of the raw material was not found at all after about 15 times of heating. On the contrary, in case of the raw material of the present invention, the deposition quantity of the oxide obtained from the vaporization of the CVD raw material is the same as that of the first experiment after the film formation of about 20 times has been completed. This state continued until the raw material is lost by the evaporation.

Embodiment 2

Another experiment was carried out using the same CVD equipment of the first embodiment. In the second embodiment, the raw material compound is Pb dipivaloyl-methanate, Zr dipivaloyl-methanate and Ti dipivaloyl-methanate, which are dissolved in the tetra-hydrofuran to obtain material solutions of the present invention. The atom ratio of the respective metal atoms of the raw material compound is obtained by a next equation.

$$Pb:Zr:Ti = 2.2:1:1$$

The concentration is 0.4 mol % for the entire solution.

An experiment for examining the vaporization of the present invention is carried out as in the first embodiment. That is, the deposition quantity of the PZT system dielectric oxide on the platinum oxide substrate is measured by heating the material solution for a plurality of numbers of the continuous vaporization at the temperature of 200° C. Further, the deposition quantity of the PZT system dielectric oxide on the same substrate is measured by heating the material solution at the vapor temperature of 180–240° C. for every 20° C. vaporization temperature. In both cases, the depositions are confirmed to be PZT system oxide film using X-ray diffraction.

The deposition quantity of PZT system dielectric oxide on the platinum oxide substrate is compared with the deposition quantity of the present invention in the following TABLE 5 and TABLE 6.

For comparison, the same organometallic compound is dissolved in the methanol solution or acetone solution instead of the tetra-hydrofuran at the same formation condition and using the same equipment. And the solid raw material organometallic compound without using organic solvent is used by CVD method.

As is apparent from TABLE 5, in case the raw material of the present invention is used, the deposition quantity of oxide film more than 10 times is obtained in comparison with the conventional raw material, methanol solution or acetone solution for the first vaporization experiment. In case of the raw material of the present invention, quite stable deposition quantity is obtained for further continuous vaporization as same as the first embodiment. But, in case of other raw materials, the deposition quantity of the oxide film decreases for further number of continuous vaporization experiment. For more 15 times of the vaporization experiment, the deposition quantity become zero because no further vaporization was occurred. As is apparent from TABLE 6, in case the CVD raw material of the present invention is used, good deposition quantity of PZT system oxide film is obtained at any temperature in comparison with the other three raw materials, because the present invention has good vaporization.

Embodiment 3

An experiment was carried out for evaluating characteristics of the capacitors of the dielectric thin film comprising the strontium titanate oxide ($SrTiO_3$) formed on the magnesium-oxide substrate, the capacitor is used for the memory devices The experiment was carried out using the CVD equipment of the ordinary hot wall type having a three source system for heating the raw material. The raw material compound of the present invention is Sr acetyl-acetonate having 0.2 mol % concentration which is dissolved in the tetra-hydro-furan. Regarding Ti, conventional iso-propoxide is used as the raw material compound. As film formation conditions, each raw material is bubbled by the argon gas as carrier gas and sent to the evaporator. The vapor temperature of the raw material is set to 195° C. for Sr and 190° C. for Ti. The reaction gas is set to oxygen, internal pressure of reactor (furnace) is set to 8 Torr, substrate temperature is set to 690° C. and reaction time is set to 10 minutes.

After the reaction has finished, the substrate temperature is cooled spontaneously until the room temperature in the oxygen flow, then an oxide dielectric thin film having a thickness of approximately 50 nm is obtained. The crystallization is examined using X-ray diffraction, then the dielectric constant and the leak current density as capacitor properties are measured by applying a DC voltage of 1.65 V to the film.

For comparison. of the deposition quantity, Sr acetylacetonate and Ti iso-propoxide is used as a raw material organometallic compound, and same formation condition and the same equipment is used for forming respective oxide system dielectric films. But, since good vaporization can not be obtained for, especially, Sr, the vaporization temperature is raised up to 280° C. in order to form the film. After the reaction is finished, in the same way as carried out for the material of the present invention, the substrate temperature is cooled spontaneously until the room temperature in the oxygen flow, then a film having a thickness of approximately 50 nm is obtained. The film characteristic and the performance as capacitor are examined as well as the present invention. The result of the examination is shown in TABLE 7.

As is apparent from TABLE 7, according to the CVD raw material of the present embodiment, a dielectric thin film having good performance as capacitor can be formed by CVD method at a lower heating temperature than the dielectric thin film formed of the conventional raw material organometallic compound. Comparing the film of the present embodiment with the film manufactured by tie conventional method, the leak current becomes less than one tenth for the same film thickness.

In the embodiment, the experiment is continuously repeated for 10 times in order to examine the repeatability of the film in the same formation condition described above. The result shows that there is little deviation, such as less than ±5%, both for the dielectric constant and the leak current density in the thin film manufactured from the CVD raw material of the embodiment, and also it becomes clear that the method of the invention has good repeatability. On the contrary, the deviation of both dielectric constant and the leak current density for the capacitor film formed by the conventional method is very large, such as about ±50%, against the value of TABLE 7.

Embodiment 4

Another experiment was carried out using the same CVD equipment of the first embodiment. In the second embodiment, the raw material compound is Pb dipivaloyl-methanate, Zr dipivaloyl-methanate and Ti dipivaloyl-methanate, which are dissolved in the tetra-hydrofuran to obtain material solutions of the present invention. The atom ratio of the respective metal atoms of the raw material compound is obtained by a next equation.

Pb:Zr:Ti=2.2:1:1

The concentration is 0.55 mol % for the entire solution. The raw material of the present embodiment is bubbled by the argon gas and sent to the evaporator and evaporated by heating at the temperature of 200° C. and then transported to the CVD reactor. The magnesium oxide substrate is used as a substrate, and substrate temperature is set to 640° C. Under the above condition, PZT system oxide dielectric film is formed on the substrate. The thickness of the film was 89 nm.

For comparison, the conventional raw material organometallic compound which is not dissolved in the tetra-hydrofuran is used for forming film. The respective temperatures are maintained at 250° C. for Pb, 230° C. for Zr and 210° C. for Ti, which are set at a higher temperature than that of the present invention. The thickness of the film was 150 nm. The above characteristics as capacitors for the two samples are shown in TABLE 8.

It is clearly understood from TABLE 8 as well as the embodiment 3 that the film of the present invention is thinner than that formed by the conventional material in spite of low temperature heating than that of the conventional method. And also a capacitor film formed by the oxide-system dielectric of the present invention has large dielectric constant and small leak current density. For the present embodiment 3, the experiment is repeated for 10 times for examining the repeatability in the same condition described in the embodiment 3. The result shows that the film formed from the material of the present embodiment 3 has less deviation, such as less than ±5%, both for the dielectric constant and the leak current density in comparison with the thin film formed from the conventional material and also has good repeatability in comparison with the conventional deviation, such as about ±50%.

Embodiment 5

In the embodiment 5, the same CVD equipment as that of the embodiment 1 is used and organometallic compound of Sr dipivaloyl-methanate, Ba dipivaloyl-methanate and Ti iso-propoxide are used as raw material for forming a barium-titanate-strontium-system-oxide-system dielectric thin film. All three kinds of the organometallic compounds are dissolved in the tetra-hydrofuran so that the concentration of the total solution becomes 0.8 mol % (atom ratio of Sr, Ba, Ti=0.5, 0.5, 1.0). As a result, one solution of the CVD raw material is obtained. The solution is heated up to 210° C. and evaporated. Magnesium oxide is used as a substrate. The temperature of the substrate is set to about 675° C. for obtaining an oxide dielectric film of $Sr_{0.5}Ba_{0.5}TiO_3$ having a film thickness of 45 nm.

For comparison, the conventional raw material which is not dissolved in the tetra-hydrofuran is used for forming film. In this case, the film thickness is 70 nm. The respective temperatures are maintained at 285° C. for Sr, 280° C. for Ti, which are set at a higher temperature than that of the present invention from the same reason as explained in the embodiment 3. The above characteristics of the two samples as capacitors are shown in TABLE 9.

It is clearly understood from TABLE 9 as well as the embodiment 3 and 4 that the capacitor film is thinner than that formed by the conventional raw material in spite of low temperature heating than that in the conventional raw material. And also an oxide-system dielectric thin film of the present invention has large dielectric constant and small leak current density. For the present embodiment 6, the experiment is repeated for 10 times for examining the repeatability in the same formation condition described in the embodiment 1. The result shows that the capacitor film formed by the material of the present embodiment 5 has less deviation, such as less than ±5%, both for the dielectric constant and the leak current density in comparison with the thin film formed by the conventional material, and also has good repeatability in comparison with the film formed by the conventional method which is very large deviation such as about ±50%.

Two kinds of Sr dipivaloyl-methanate and Ti dipivaloyl-methanate in the above three organic metal compounds are dissolved in the tetra-hydrofuran so that the concentration of the entire solute will be 0.1 mol % (the atom ratio of Sr,Ti=1:1), and two kinds of Ba dipivaloyl-methanate and Ti dipivaloyl-methanate in the above three organometallic compounds are dissolved in the tetra-hydrofuran so that the concentration of the entire solute will be 0.2 mol % (the atom ratio of Ba,Ti=1:1), respectively, for obtaining two solutions of the present invention. Oxide dielectric films of $SrTiO_3$ and $BrTiO_3$ each having a film thickness of 50 nm are obtained under the same condition for the above-mentioned $Sr_{0.5} Ba_{0.5} TiO_3$.

For comparison, the conventional organometallic compound which is not dissolved in the tetra-hydrofuran is used for forming film. The films formed as capacitors by the above methods are shown in TABLE 10.

It is clearly understood from TABLE 10 as well as the embodiment 3 and 4 that the capacitor film is thinner than that formed by the conventional raw material in spite of low temperature heating than that in the conventional raw material. And also an oxide-system dielectric thin film of the present invention has large dielectric constant and small leak current density. For the present embodiment 6, the experiment is repeated for 10 times for examining the repeatability in the same formation condition described in the embodiment 1. The result shows that the capacitor film formed by the material of the present embodiment 5 has less dispersion, such as less than ±5%, both for the dielectric constant and the leak current density in comparison with the thin film formed by the conventional material, and also has good repeatability in comparison with the film formed by the conventional method which is very large dispersion such as about ±50%.

Embodiment 6

In the embodiment 6, the same CVD equipment as that of the embodiment 1 is used and organometallic compound of Sr dipivaloyl-methanate, Ba dipivaloyl-methanate and Ti iso-propoxide are used as raw material for forming a barium-titanate-strontium-system-oxide-system dielectric thin film. In case of the materials Sr and Ba, each dipivaloyl-methanate dielectric of Sr, Ba is dissolved in the tetra-hydrofuran by 0.35 mol % concentration to obtain two kinds of raw material. The raw material of the present embodiment is bubbled by the argon gas, which is carrier gas, and sent to the evaporator and evaporated by heating at the temperature of 210° C. and then transported to the reactor. Since Ti iso-propoxide is liquid raw material compound, it is heated up to 180° C. in order to vaporize. The magnesium-oxide is used as a substrate and the substrate temperature is set to 655° C. and an oxide dielectric thin film having film thickness of 45 nm is obtained.

For comparison, the conventional raw material which is not dissolved in the tetra-hydrofuran is used for forming film. In this case, the film thickness is 125 nm. The respective temperatures are maintained at 235° C. for Sr, 255° C. for Ti, which are set at a higher temperature than that of the present invention. The above characteristics of the two samples as capacitors are shown in TABLE 11.

It is clearly understood from TABLE 11 as well as the embodiment 3, 4 and 5 that the capacitor film is thinner than that formed by the conventional raw material in spite of low temperature heating than that in the conventional raw material. And also an oxide-system dielectric thin film of the present invention has large dielectric constant and small leak current density. For the present embodiment 6, the experiment is repeated for 10 times for examining the repeatability in the same formation condition described in the embodiment 1. The result shows that the capacitor film formed by the material of the present embodiment 5 has less deviation, such as less than ±5%, both for the dielectric constant and the leak current density in comparison with the thin film formed by the conventional material, and also has good repeatability in comparison with the film formed by the conventional method which is very large deviation such as about ±0%.

The above three organometallic compounds are all dissolved in the tetra-hydrofuran so that the concentration of the entire solute will be 0.8 mol % (the atom ratio of Sr, Ba, Ti is 1:1:2) for obtaining CVD raw material in one solution of the present invention. Using the above solution material, a barium-strontium titanate system dielectric thin film is formed in the same way as described above, and its performance as a capacitor is examined. As a result, substantially the same and good characteristic is obtained as well as TABLE 11.

In the above embodiments 3, 4 and 5, the largest reason of which the performance of the capacitor using the oxide system dielectric film formed from the conventional raw material organometallic compound is not good, depends on the fact that the raw material compound is hard to be vaporized by heating and the raw material is dissolved by heating at relatively high temperature, thereby the material compound is hard to be transported to the reactor. In other words, it is assumed that the largest reason of which the performance of the oxide system dielectric film of the conventional raw material as a capacitor for memory devises is not good, depends on ununiformity of formation of the formation film caused by unstable transportation for each raw material.

Using the raw material of the present invention, the thin film of dielectric material such as PLZT, barium-titanate, tantalum-oxide, lead-titanate and bismuth-titanate is formed for several times using the same raw material as well as the methods in the embodiments 1–5. In any occasion, a dielectric thin film having a good performance as a capacitor is obtained with a good repeatability as well as the former embodiments in comparison with the conventional method.

Many kinds of solvents are examined which dissolve the conventional organic metal raw material in the same methods of embodiments 1 and 2. The result shows that no improvement of vaporization, no stable effect of the material for multiple use and no stable vaporization effect is found by heating at low temperature such as the tetra-hydrofuran used in the present invention. Therefore, the tetra-hydrofuran have to be used in the present invention for the organic solvent which dissolves the organometallic compound. Organic solvent of the present invention may be any solvent which includes the tetra-hydrofuran more than 90 weight %, desirably any solvent which includes the tetra-hydrofuran more than 95 weight %, more desirably the solvent may include only tetra-hydrofuran. When the tetra-hydrofuran becomes less than 90 weight %, it becomes difficult to obtain a desired heating vaporization characteristic and a stability for a long period. The solvent may be any solvent which dissolves well in the tetra-hydrofuran, for example, an alcohol group such as methanol, ethanol, propanol, a ketone group such as acetone dimethyl-ketone, methyl-ethyl-ketone and benzene. The detailed effect of the tetra-hydrofuran is not clearly known, but it is assumed in view of the result of various examinations that the tetra-hydrofuran forms any combination in addition to the organometallic compound, and the resultant product having good vaporization characteristic is formed.

Further in the present invention, the single organic metal compound may be dissolved in the tetra-hydrofuran as shown in the embodiments 1 and 3 or many organometallic compound may be dissolved simultaneously to obtain one solution as shown in the embodiments 2 and 4. In this occasion, although the concentration of the organometallic compound in the tetra-hydrofuran can not be defined uniformly since the solubility is different for each material, it is able to select it in the range of around 0.001~10 mol %.

According to the above selection, an improved effect of the vaporization of the raw material is obtained as shown in any of above embodiments. The appropriate value of the concentration is about 0.1~1 mol % as indicated in the embodiment, but it is not restricted within the above range.

It is confirmed that many kinds of raw material compounds used in the present invention can be used for a capacitor for memory devises which is formed from the organic material compound of the dielectric oxide as well as the former embodiments. It is also confirmed that, if a metal atom is a compound which is coupled together with an organic group through oxygen atoms, a good effect can be attained for the tetra-hydrofuran as described above.

Therefore, in the present invention it is desirable to use acetyl-acetonate, dipivaloyl-methanate, alkoxide, hexafluoro-acetyl-acetonate, penta-fluoro-propanoil-pivaloyl-methanate, cyclopentadienyl and their derivatives. In the present invention, metoxide, etoxide, isopropoxide may be use as the alkoxide. In any above cases, it is proved that above-mentioned good stability for a long period and improvement effect for vaporization are attained using the solution in which they dissolve in the tetra-hydrofuran. Further, in the above case, it is also proved that, if the metal atom is Pb, Ti, Zr or alkaline earth metal, more good performance as a capacitor can be obtained for the formed dielectric film. It is also proved that the similar performance is obtained in case of the metal atoms La, Ta or Bi. Sr, Ba may be used as the alkaline earth metal.

As shown in the embodiments 1–5, it is proved that, if the metal atom of the organic metal raw material is at least one kind of selected metals from Pb, Ti, Zr and alkaline earth metal, the effect of the present invention become better and better performance can be obtained for the formed dielectric capacitor film. Especially in case that the metal atom is Sr, Ba and Ti, and also in case that the metal atom is their dipivaloyl-methanate system compound, dipivaloyl-methanate system compound of Sr and/or Ba and Ti isopropoxide, it is proved that the stable effect for a long period and improved evaporation effect can be attained in the present invention.

TABLE 1

Deposition quantity (mg/cm$^2$) of Sr oxide using organic Sr compound for a plurality of numbers of continuous vaporization

|  | first time | second time | fifth time | tenth time |
|---|---|---|---|---|
| solid raw material (conventional method) | 0.11 | 0.08 | 0.05 | 0.01 |
| methanol solution | 0.12 | 0.09 | 0.04 | 0.03 |
| acetone solution | 0.12 | 0.10 | 0.06 | 0.01 |
| THF solution (present invention) | 2.30 | 2.32 | 2.31 | 2.29 |

TABLE 2

Deposition quantity (mg/cm$^2$) of Sr oxide using organic Sr compound for a plurality of temperature of continuous vaporization

|  | 180° C. | 200° C. | 220° C. | 240° C. |
|---|---|---|---|---|
| solid raw material (conventional method) | 0.02 | 0.05 | 0.11 | 0.24 |
| methanol solution | 0.01 | 0.06 | 0.12 | 0.23 |
| acetone solution | 0.02 | 0.05 | 0.12 | 0.21 |
| THF solution (present invention) | 1.08 | 1.59 | 2.30 | 3.85 |

TABLE 3

Deposition quantity (mg/cm$^2$) of Ba oxide using organic Ba compound for a plurality of numbers of continuous vaporization

|  | first time | second time | fifth time | tenth time |
|---|---|---|---|---|
| solid raw material (conventional method) | 0.10 | 0.08 | 0.03 | 0.01 |
| methanol solution | 0.11 | 0.09 | 0.03 | 0.02 |
| acetone solution | 0.09 | 0.10 | 0.06 | 0.01 |
| THF solution (present invention) | 2.51 | 2.49 | 2.52 | 2.52 |

TABLE 4

Deposition quantity (mg/cm$^2$) of Ba oxide using organic Ba compound for a plurality of numbers of continuous vaporization

|  | 180° C. | 200° C. | 220° C. | 240° C. |
|---|---|---|---|---|
| solid raw material (conventional method) | 0.02 | 0.05 | 0.10 | 0.19 |
| methanol solution | 0.01 | 0.06 | 0.11 | 0.22 |
| acetone solution | 0.02 | 0.05 | 0.09 | 0.19 |
| THF solution (present invention) | 0.09 | 1.63 | 2.51 | 5.67 |

TABLE 5

Deposition quantity (mg/cm$^2$) of oxide using PZT raw material for a plurality of numbers of continuous vaporization

|  | first time | second time | fifth time | tenth time |
|---|---|---|---|---|
| solid raw material (conventional method) | 0.31 | 0.29 | 0.24 | 0.21 |
| methanol solution | 0.32 | 0.30 | 0.23 | 0.20 |
| acetone solution | 0.33 | 0.29 | 0.24 | 0.21 |
| THF solution (present invention) | 4.29 | 4.32 | 4.26 | 4.28 |

TABLE 6

Deposition quantity (mg/cm$^2$) of oxide using PZT raw material for a plurality of temperature of continuous vaporization

|  | 180° C. | 200° C. | 220° C. | 240° C. |
|---|---|---|---|---|
| solid raw material (conventional method) | 0.22 | 0.31 | 0.46 | 0.66 |
| methanol solution | 0.22 | 0.32 | 0.49 | 0.63 |
| acetone solution | 0.24 | 0.33 | 0.48 | 0.67 |
| THF solution (present invention) | 3.35 | 4.29 | 5.68 | 7.63 |

TABLE 7

|  | Equivalent film thickness (nm) | Dielectric Constant | Leak current density (A/cm$^2$) |
|---|---|---|---|
| Present Invention | 0.83 | 230 | $1.2 \times 10^{-8}$ |
| Conventional Method | 0.91 | 210 | $8.0 \times 10^{-7}$ |

TABLE 8

| | Equivalent film thickness (nm) | Dielectric Constant | Leak current density (A/cm$^2$) |
|---|---|---|---|
| Present Invention | 0.39 | 860 | $4.0 \times 10^{-8}$ |
| Conventional Method | 0.72 | 790 | $3.2 \times 10^{-7}$ |

TABLE 9

| | Equivalent film thickness (nm) | Dielectric Constant | Leak current density (A/cm$^2$) |
|---|---|---|---|
| Present Invention | 0.65 | 410 | $1.0 \times 10^{-8}$ |
| Conventional Method | 0.83 | 320 | $6.0 \times 10^{-7}$ |

TABLE 10

| | Equivalent film thickness (nm) | Dielectric Constant | Leak current density (A/cm$^2$) |
|---|---|---|---|
| Present Invention (SrTiO$_3$) | 0.79 | 240 | $1.3 \times 10^{-8}$ |
| Conventional Method (SrTiO$_3$) | 0.95 | 200 | $9.0 \times 10^{-7}$ |
| Present Invention (BaTiO$_3$) | 0.97 | 195 | $2.2 \times 10^{-8}$ |
| Conventional Method (BaTiO$_3$) | 1.19 | 160 | $1.0 \times 10^{-7}$ |

TABLE 11

| | Equivalent film thickness (nm) | Dielectric Constant | Leak current density (A/cm$^2$) |
|---|---|---|---|
| Present Invention | 0.44 | 390 | $4.5 \times 10^{-8}$ |
| Conventional Method | 1.27 | 375 | $9.0 \times 10^{-7}$ |

What is claimed is:

1. A capacitor for memory devices including a barium strontium titanate system dielectric film, the film being formed from a chemical vapor deposition source material comprising a liquid solution of respective organometallic compounds of barium, strontium, and titanium dissolved in tetrahydrofuran.

2. The capacitor according to claim 1 wherein the organometallic compounds are selected from the group consisting of metal acetyl-acetonates, metal dipivaloyl-methanates, metal alkoxides, metal hexafluoro-acetyl-acetonates, metal penta-fluoro-propanoil-pivaloyl methanates, metal cyclopentadienyl, and derivatives of those compounds.

3. The capacitor according to claim 1 wherein the organometallic compounds are selected from the group consisting of dipivaloyl-methanate compounds and derivatives of those compounds.

4. A capacitor for memory devices including a barium strontium titanate system dielectric film, the film being formed from a chemical vapor deposition source material comprising a liquid organometallic compound of titanium dissolved in a first solution comprising, as a solvent, tetrahydrofuran, and a second solution in which the organometallic compounds of barium and strontium are dissolved in tetrahydrofuran.

5. A capacitor for memory devices including a barium strontium titanate system dielectric film, the film being formed from a chemical vapor deposition source material comprising three solutions, the solutions respectively including an organometallic compound of barium of strontium, and of titanium dissolved in tetrahydrofuran.

6. A capacitor for memory devices including a barium strontium titanate system dielectric film, the film being formed from a chemical vapor deposition source material comprising a liquid organometallic compound of titanium, and a liquid solution of organometallic compounds of barium and of strontium dissolved in tetrahydrofuran.

7. The capacitor according to claim 6 wherein the organometallic compounds are selected from the group consisting of metal acetyl-acetonates, metal dipivaloyl-methanates, metal alkoxides, metal hexafluoro-acetyl-acetonates, metal penta-fluoro-propanoil-pivaloyl methanates, metal cyclopentadienyl, and derivatives of those compounds.

8. The capacitor according to claim 6 wherein said liquid organometallic compound of titanium is titanium isopropoxide, and the organometallic compounds of barium and of strontium are selected from the group consisting of dipivaloyl-methanate compounds and derivatives of those compounds.

9. A capacitor for memory devices including a barium strontium titanate system dielectric film, the film being formed from a chemical vapor deposition source material comprising first and second liquid solutions respectively including an organometallic compound of barium and of strontium dissolved in tetrahydrofuran and further including a liquid organometallic compound of titanium.

10. The capacitor according to claim 9 wherein each of the organometallic compounds is selected from the group consisting of metal acetyl-acetonates, metal dipivaloyl-methanates, metal alkoxides, metal hexafluoro-acetyl-acetonates, metal penta-fluoro-propanoil-pivaloyl methanates, metal cyclopentadienyl, and compounds of those derivatives.

11. A capacitor for memory devices including a barium strontium titanate system dielectric film, the film being formed from a chemical vapor deposition source material comprising a solution of organometallic compounds containing barium strontium, and titanium dissolved in a solvent including tetrahydrofuran.

12. The capacitor according to claim 11 wherein each of the organometallic compounds is respectively dissolved in one of the solutions.

13. The capacitor according to claim 12 wherein the organometallic compounds are selected from the group consisting of metal acetyl-acetonates, metal dipivaloyl-methanates, metal alkoxides, metal hexafluoro-acetyl-acetonates, metal penta-fluoro-propanoil-pivaloyl methanates, metal cyclopentadienyl, and derivatives of those compounds.

14. The capacitor according to claim 11 wherein the organometallic compounds are selected from the group consisting of metal acetyl-acetonates, metal dipivaloyl-methanates, metal alkoxides, metal hexafluoro-acetyl-acetonates, metal penta-fluoro-propanoil-pivaloyl methanates, metal cyclopentadienyl, and derivatives of those compounds.

15. The capacitor according to claim 11 wherein the organometallic compounds are dipivaloyl-methanate compounds and derivatives of those compounds.

* * * * *